United States Patent [19]

Nubani

[11] 4,302,725
[45] Nov. 24, 1981

[54] METHOD FOR TESTING PANEL-TO-FUNNEL SEALING LAYER OF A CATHODE-RAY TUBE

[75] Inventor: Jawdat I. Nubani, Clarks Summit, Pa.

[73] Assignee: RCA Corporation, New York, N.Y.

[21] Appl. No.: 135,174

[22] Filed: Mar. 28, 1980

[51] Int. Cl.³ ............................................. G01R 31/22
[52] U.S. Cl. ...................................... 324/404; 29/574
[58] Field of Search ................... 29/574; 324/403, 404

[56] References Cited

U.S. PATENT DOCUMENTS 3,943,438  3/1976  Barber et al. .................... 324/404

OTHER PUBLICATIONS

Conductive Dand Apparatus for Testing Frit Seal Between Faceplate Panel and Funnel of a Cathode-Ray Tube, by Bachinger et al., RCA Technical Notes No. 1111, May 14, 1975, two sheets.

Primary Examiner—Michael J. Tokar
Attorney, Agent, or Firm—E. M. Whitacre; G. H. Bruestle; L. Greenspan

[57] ABSTRACT

Method of testing a completed cathode-ray tube comprises applying a higher-than-operating voltage between the metal structure around the sidewall of the panel of the tube and the internal conductive coating on the funnel of the tube whereby the panel-to-funnel sealing layer is punctured if it does not have sufficient electrical-breakdown strength.

10 Claims, 1 Drawing Figure

METHOD FOR TESTING PANEL-TO-FUNNEL SEALING LAYER OF A CATHODE-RAY TUBE

BACKGROUND OF THE INVENTION

This invention relates to a novel method for testing the electrical breakdown characteristic of the hermetic seal between the panel and the funnel of a completed cathode-ray tube.

In one popular design of a color television picture tube, which is a type of cathode-ray tube, a glass faceplate panel is sealed to a conical glass funnel with a sealing layer of devitrified glass. The sealing layer is produced by applying a layer of a ground glass or frit to the seal land of the funnel, then the panel is placed on top of the funnel with the panel seal land against the frit layer, and then the assembly is heated until the frit layer melts and wets the seal lands and forms the sealing layer. Subsequently, the assembly is cooled to room temperature, and the assembly of the tube is completed.

Since the tube carries very high voltages, it is necessary for the sealing layer to have a high breakdown voltage in addition to having hermetic qualities. An electrical breakdown in the sealing layer renders the tube inoperative. Such breakdowns can be the result of the failure to remove conductive material from one of the seal lands, or a partial failure of the molten glass to wet all of the two seal lands, or impurities in the frit, or other causes.

It has been the practice to test the electrical breakdown characteristic of the sealing layer between the panel and the funnel by applying a flexible or resilient band of electrically-conductive material against the external surface of the sealing layer, electrically grounding the band through a grounding circuit, applying a substantially higher-than-operating testing voltage to the internal funnel coating through the anode button of the tube, and sensing a surge in leakage current in the grounding circuit if the sealing layer is defective. Contacting the band with the seal is degrading to both the sealing layer and the band. Also, relatively complex testing machines must be employed, for example, the apparatus disclosed in U.S. Pat. No. 3,943,438 to H. H. Barber et al.

SUMMARY OF THE INVENTION

The novel method follows the prior methods, as exemplified by the cited patent to Barber et al., except that a nonobvious and more desirable method is used to apply the high testing voltage across the seal. The novel method is used with tubes that include an electrically-conducting metal structure, such as is used for implosion protection, around the sidewalls of the panel and spaced from the sealing layer. It has been found, unexpectedly, with such tubes, to be unnecessary to physically contact the external surface of the sealing layer with a flexible or resilient band. According to the novel method, a substantially higher-than-operating testing voltage is applied across the metal structure and the internal funnel coating. The testing voltage is of such value that a structurally-sound sealing layer will be unaffected by the electric field produced by the applied voltage, but a defective sealing layer will be punctured, and the tube will be devacuated through the puncture. The puncture may be detected subsequently by the presence of excess gas in the tube, or at the time of puncture, by detecting a surge of current in the grounding circuit.

BRIEF DESCRIPTION OF THE DRAWING

The sole FIGURE is an elevational view, partially broken away, partially sectional, of a tube on which the novel method is being practiced.

DETAILED DESCRIPTION OF THE PREFERRED EMBODIMENT

Figure 1:
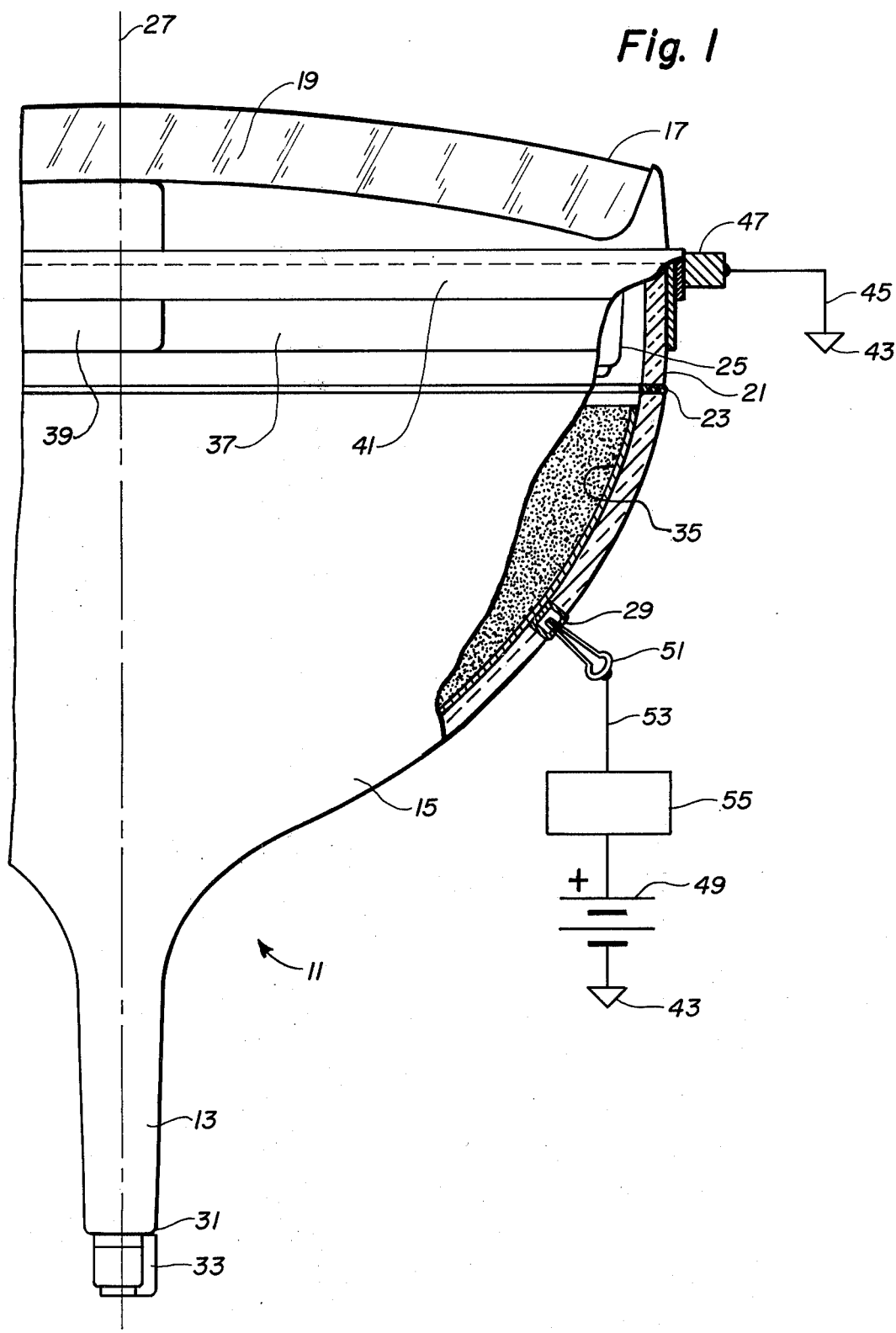

Hermetic seals of devitrified glass in cathode-ray tubes and methods for testing them for electrical breakdown are known and need not be described in detail here since they have been described previously; for example, in U.S. Pat. Nos. 2,889,953 to S. A. Claypoole, 3,188,662 to G. L. Fassett et al., 3,701,674 to L. B. Kimbrough and 3,943,438 to H. H. Barber et al.

The sole FIGURE shows so much of a color television picture tube, which is a type of cathode-ray tube, as is necessary for understanding and practicing the novel method. The tube comprises an evacuated envelope 11 including a cylindrical neck 13 extending from the small end of a conical funnel 15. A rectangular faceplate panel 17, including a viewing window 19 and a peripheral sidewall 21, is sealed to the large end of the funnel 15 by a devitrified glass sealing layer 23. A tricolor mosaic screen (not shown) is supported on the inner surface of the window 19. A shadow mask 25 is supported within the panel 17 close to the screen to achieve color selection. The tube has a longitudinal centerline 27 which passes through the panel 17, the funnel 15 and the neck 13. An anode button 29 provides an electrical connection through the wall of the funnel 15.

An electron-gun mount assembly (not shown) is mounted in the neck 13. The distal end of the neck 13 is closed by a stem 31 having terminal pins or leads extending through the stem and a base 33 attached to the leads. An electrically-conductive coating 35 comprising graphite, iron oxide and a silicate binder is supported on the inner surface of the funnel 15 and is electrically connected to the anode button 29.

A metal reinforcing structure, substantially as described in U.S. Pat. No. 3,845,530 to R. B. Platt, is installed around the sidewall 21 of the panel 17. The metal structure includes a pair of U-shaped rim plates 37 and 39 which are contoured to encircle the panel 17. A tensioned metal band 41 is fixed around the rim plates 37 and 39 as with a notched seal (not shown). Alternatively, the metal structure may be a single continuous metal shell that is either thermally shrunk on the panel 17 around the sidewall 21, or is loosely fit around the panel sidewall 21 and the space therebetween filled with a suitable filler.

As shown in the sole FIGURE, the tube is completely assembled, evacuated of gases and hermetically sealed, and, with the base 33 and metal reinforcing structure 35 installed, the tube is ready for installation in a television receiver, where a high operating voltage of about 25 to 35 kilovolts (kv) is applied to the internal funnel coating 35. By applying the novel method, a tube with a glass sealing layer 23 that is apt to break down electrically in the receiver can be made to break down prior to installing the tube in the receiver. This can save the expense of a repair to the receiver and a replacement of the tube either in the receiver assembly line or in the field.

By a preferred embodiment for practicing the novel method, the metal band 41 is connected to ground potential 43 through a grounding circuit 45 and an electrically-conducting magnet 47, which is magnetically adhered to and in physical and electrical contact with the metal band 41. At the same time, a high direct-current testing voltage that is substantially higher than the operating voltage of the tube, and preferably more than 40% higher, is applied to the funnel coating 35 through the anode button 29. In this embodiment, where the operating voltage of the tube is about 30 kv, a testing voltage of about plus 45 to plus 65 kv, and preferably about 50 kv from a voltage source 49 is applied to the anode button 29 through a spring clip 51 and a high-voltage circuit 53. With the high-voltage circuit 53 and the grounding circuit 45 so connected, the high testing voltage appears principally across the sealing layer 23 so that a high electric field is developed across the sealing layer 23. If there is a thin portion to the sealing layer 23, or if there is an electrically-conducting path through or around the sealing layer 23 that has a weak resistance to breakdown, a current flow through that area will puncture a hole therethrough and permit air to pass into the tube.

It is the practice to test a completely-assembled tube for its operating characteristics just prior to shipping it from the tube factory. During this test, each tube that has a high gas content wll be discovered and rejected. Alternatively, the grounding circuit 45 or the high-voltage circuit 53 may include means (indicated schematically by the box 55 in the high-voltage circuit 53) for sensing an unusual rise in current, indicating a puncture is taking place, and can signal that the tube should be rejected.

The novel method may be practiced on stationary equipment, in which case the high-voltage circuit 53 may include a switch for energizing the spring clip 51 when it is so desired. The novel method may be practiced with the tube on a moving conveyor, in which case each of the grounding circuit 45 and the high-voltage circuit 53 may include a stationary bus bar and a movable wiper contact indirectly connected to the tube. Also, the grounding circuit may be connected to the anode button 29 and the high-voltage circuit 53 connected to the metal band 47. In that case, it is preferred that the applied testing voltage is negative with respect to ground potential. In all embodiments, voltage polarities may be reversed if desired.

It is not understood why substantially all of the applied high voltage appears across the sealing layer 23 when the metal structures around the sidewall 21 and the conducting layer 35 are each spaced from the sealing layer 23. Previously, it was thought that a grounding strap must contact or be very close to the outside surface of the sealing layer 23. An attempt was made to measure the potential on the surface of the sealing layer with a high voltage applied to the tube as described in the preferred embodiment. At turn-on of the voltage, a charge was discernible using an electrostatic voltmeter for indication. The voltage recorded was a 8 kv with 26 kv having been applied to the anode. Wiping the seal area with a ground wand removed this charge, and no voltage could be read on the voltmeter. The turn-on charge is believed to occur because free ions in the sealing layer and the sidewall glass travel to the respective surfaces, which are at negative polarities relative to the inside of the tube. At a turn-on of 50 kv, the full 50 kv appears across the sealing layer, but it quickly drops to a potential that is the anode voltage minus whatever charge potential a molecular point on the outside surface of the sealing layer rose to. After this initial charge, the ions in the seaing layer and the glass sidewall are depleted and do not cause a further increase in the charge except by a very slow ion migration which takes hours or days to effect depending on surface condition and temperature. This phenomenon was demonstrated by the experiment of wiping the charge off of the area and leaving the anode voltage present. After six hours, some change was again observed. After this period of time, 2.7 kv was collected indicting that ion migration was occurring.

By one molecular model, each molecule at the surface charges and effectively reduces the potential across the sealing layer by about the same amount. Using a grounding band in contact with the sealing layer is only a little more effective. Physical contact to some of the molecules at the sealing-layer surface certainly does increase the probability that a failure point will have a longer exposure to the full anode voltage during a test, but it does not insure that condition. It would appear that as long as the path to a ground point is no further from the sealing layer than the distance necessary to break down at the voltage being applied to the tube, a breakdown test will have been performed. The longest distance between the sealing layer and the rim plates 37 and 39 appears to be on a 19 V tube at about one inch. This distance broke down at about 39 kv.

One other test was performed to determine whether the potential on the surface of the sealing layer could be better defined. High voltage was applied between the external coating of the tube and the rim plates 37 and 39. The glass area across the sealing layer was probed. No gradient could be observed, indicating that insufficient ion carriers were present to maintain the sealing layer at ground potential with the on-rush of ions at turn-on.

In summary, it would appear that having a grounding band around and in physical contact with the surface area of the sealing layer is not important as long as the path between the sealing layer and the system ground is less than the distance needed for the applied voltage to break down in air. One way of insuring the total grounding of the sealing layer is to spray it with a conductive coating. This can be equivalent to the structure of a tube after having been operated in a home-receiver environment with its accumulation of dust and moisture thereon. How important this is to field-failure modes is unknown at present.

I claim:

1. In the manufacture of a cathode-ray tube of the type comprising (i) an evacuated envelope including an electrically-insulating glass faceplate panel having an integral peripheral sidewall and an electrically-insulating funnel hermetically sealed to said sidewall with a sealing layer of an electrically-insulating substance, (ii) an electrically-conducting coating on the internal surface of said funnel, and (iii) an electrically-conducting metal structure around the outside of said sidewall, a method for testing said sealing layer comprising, prior to connecting said tube with its ultimate circuitry for functional use, wherein a high operating DC voltage is applied to said internal funnel coating, the step of applying a high testing DC voltage between said metal structure and said internal funnel coating, said testing DC voltage being substantially higher than said operating DC voltage, whereby, if said sealing layer has insufficient resistance to electrical breakdown, said sealing layer is punctured by a leakage current and said envelope is devacuated through said puncture.

2. The method defined in claim 1 wherein said sealing layer consists essentially of a devitrified glass.

3. The method defined in claim 1 wherein said metal structure comprises two metal rim plates, which in combination, encircle said sidewall and a metal band around said rim plates.

4. The method defined in claim 1 wherein said metal structure comprises a continuous metal shell around said sidewall.

5. The method defined in claim 1 wherein said testing DC voltage is at least 40% higher than said operating DC voltage.

6. The method defined in claim 1 wherein said testing DC voltage is in the range of 45 to 65 kilovolts.

7. The method defined in claim 1 wherein said testing DC voltage is about 50 kilovolts with respect to ground potential.

8. The method defined in claim 1 wherein said metal structure is grounded through a grounding circuit, and a high positive DC voltage is applied to said internal funnel coating.

9. The method defined in claim 8 including detecting a substantial rise in current through said grounding circuit.

10. The method defined in claim 1 including, after applying said testing DC voltage, detecting the presence of excessive gas in said envelope.

* * * * *